US 7,849,373 B2

(12) United States Patent
Shin et al.

(10) Patent No.: US 7,849,373 B2
(45) Date of Patent: Dec. 7, 2010

(54) METHOD OF TESTING A MEMORY MODULE AND HUB OF THE MEMORY MODULE

(75) Inventors: Seung-Man Shin, Suwon-si (KR); Byung-Se So, Sungnam-si (KR); Seung-Jin Seo, Suwon-si (KR); You-Keun Han, Yongsin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 12/285,149

(22) Filed: Sep. 30, 2008

(65) Prior Publication Data
US 2009/0044062 A1 Feb. 12, 2009

Related U.S. Application Data

(62) Division of application No. 11/118,377, filed on May 2, 2005, now Pat. No. 7,447,954.

(60) Provisional application No. 60/579,657, filed on Jun. 16, 2004.

(30) Foreign Application Priority Data

Jun. 11, 2004 (KR) ................................ 2004-43000
Jan. 7, 2005 (KR) ................................. 2005-1495

(51) Int. Cl.
*G11C 29/00* (2006.01)
(52) U.S. Cl. ................... 714/718; 714/731; 714/715; 714/25; 714/30; 714/42; 714/48; 714/719; 714/733; 714/734; 714/735; 714/736; 714/742; 330/253; 330/255; 330/51; 326/86; 326/127; 327/307; 365/201
(58) Field of Classification Search .................... None
See application file for complete search history.

(56) References Cited

U.S. PATENT DOCUMENTS 5,432,476 A * 7/1995 Tran ........................... 330/255
6,070,255 A 5/2000 Dell et al.
6,233,182 B1 5/2001 Satou et al.

(Continued)

FOREIGN PATENT DOCUMENTS

DE 103 35 978 B4 3/2005

(Continued)

OTHER PUBLICATIONS

Chinese Office Action dated Feb. 16, 2009 for corresponding Chinese Patent Application No. 2005100778860.

(Continued)

*Primary Examiner*—John P Trimmings
(74) *Attorney, Agent, or Firm*—Harness, Dickey & Pierce, P.L.C.

(57) ABSTRACT

Example embodiments relate to a method and system of testing a memory module having the process of receiving single ended input signals via differential input terminals through which differential pairs of packet signals may be received from a testing equipment, wherein a number of terminals of the testing equipment may be different from a number of terminals of the memory module, and testing memory chips of the memory module based on the single ended input signals.

10 Claims, 16 Drawing Sheets

U.S. PATENT DOCUMENTS

| | | | |
|---|---|---|---|
| 6,664,851 B1 * | 12/2003 | Pihlstrom et al. | 330/51 |
| 6,683,484 B1 * | 1/2004 | Kueng et al. | 327/307 |
| 6,754,117 B2 | 6/2004 | Jeddeloh | |
| 6,819,142 B2 * | 11/2004 | Viehmann et al. | 326/127 |
| 6,996,749 B1 * | 2/2006 | Bains et al. | 714/42 |
| 7,197,684 B2 * | 3/2007 | Fang et al. | 714/742 |
| 7,210,059 B2 | 4/2007 | Jeddeloh | |
| 7,212,423 B2 | 5/2007 | Vogt | |
| 7,266,633 B2 | 9/2007 | James | |
| 7,356,742 B2 | 4/2008 | Aoki et al. | |
| 7,400,173 B1 | 7/2008 | Kwong et al. | 326/86 |
| 7,412,627 B2 * | 8/2008 | Bains et al. | 714/42 |
| 7,434,118 B2 * | 10/2008 | Moessinger et al. | 714/715 |
| 2002/0078408 A1 | 6/2002 | Chambers | |
| 2002/0093874 A1 | 7/2002 | Ukon | |
| 2004/0070451 A1 * | 4/2004 | Pihlstrom et al. | 330/253 |
| 2004/0246786 A1 | 12/2004 | Vogt | |
| 2005/0060600 A1 | 3/2005 | Jeddeloh | |
| 2005/0105350 A1 | 5/2005 | Zimmerman | |
| 2005/0259480 A1 | 11/2005 | Bains et al. | |
| 2005/0283681 A1 | 12/2005 | Jeddeloh | |
| 2006/0218331 A1 | 9/2006 | James | |
| 2007/0124548 A1 | 5/2007 | Vogt | |

FOREIGN PATENT DOCUMENTS

| | | |
|---|---|---|
| KR | 2001-0083784 | 9/2001 |
| WO | WO 2004/017162 A2 | 2/2004 |

OTHER PUBLICATIONS

JEDEC Standard "Fully Buffered DIMM (FBDIMM): DFx Design for Validation and Test", Jedec Solid State Technology Association, JESD82-28 (Feb. 2008).

Jeddeloh, Joe: Fully Buffered (FB Dimm), JEDEX, San Jose, Apr. 15-16, 2004, conference documents from the Internet (status as of May 2, 2007) http://download.micron.com/pdf/presentations/jedex/fbdimm_micron_2004.pdf.

JEDEC Standard No. 82-20: "FBDIMM: Advanced Memory Buffer (AMB)", JEDEC Mar. 2007.

* cited by examiner

| TAB FOR MEMORY MODULE | | TAB FOR TESTING MEMORY MODULE | |
|---|---|---|---|
| PN(PRIMARY NORTHBOUND) | 14 | /CS | 2 |
| /PN(PRIMARY NORTHBOUND) | 14 | /RAS | 1 |
| PS(PRIMARY SOUTHBOUND) | 10 | /CAS | 1 |
| /PS(PRIMARY SOUTHBOUND) | 10 | /WE | 1 |
| SN(SECONDARY NORTHBOUND) | 14 | CKE | 2 |
| /SN(SECONDARY NORTHBOUND) | 14 | ODT | 1 |
| SS(SECONDARY SOUTHBOUND) | 10 | ADDRESS | 15+3 |
| /SS(SECONDARY SOUTHBOUND) | 10 | DQ+DQS | 72+18 |
| TOTAL | 96 | TOTAL | 116 |

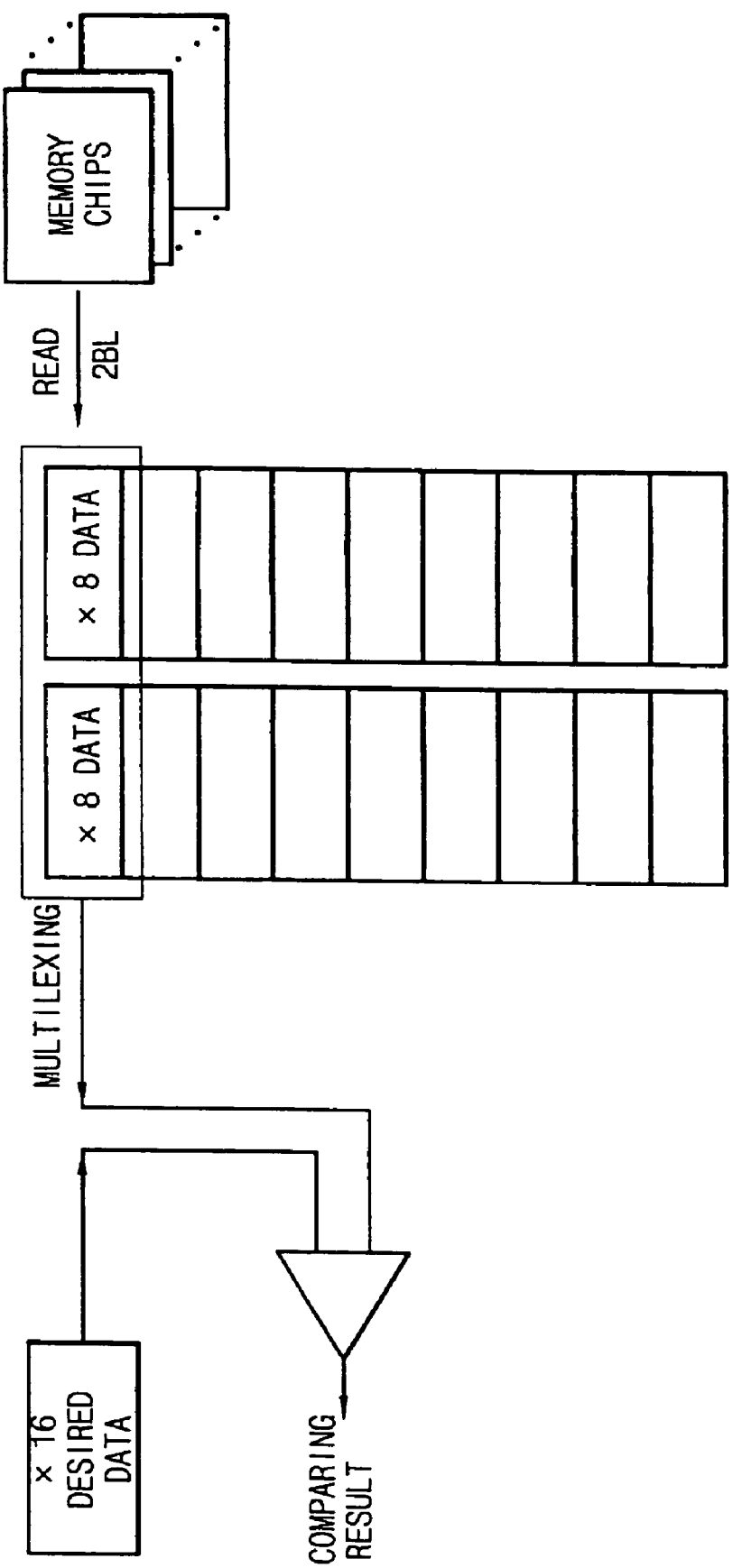

METHOD OF TESTING A MEMORY MODULE AND HUB OF THE MEMORY MODULE

PRIORITY STATEMENT

This application is a divisional of U.S. application Ser. No. 11/118,377 filed on May 2, 2005, now U.S. Pat. No. 7,447,954 and claims priority under 35 U.S.C. §119 of Korean Patent Application No. 2004-43000 filed on Jun. 11, 2004, U.S. provisional application Ser. No. 60/579,657, filed on Jun. 16, 2004, and Korean Patent Application No. 2005-1495 filed on Jan. 7, 2005, the disclosure of each of which is herein incorporated by reference in its entirety.

BACKGROUND OF THE INVENTION

1. Field of the Invention

The present invention relates to a method of testing a memory module and a hub of memory module.

2. Description of the Related Art

The increase of speed and/or circuit integration of main memory may correlate with the enhancement of operating speeds of central processing circuits. A bus architecture, which may perform at high speeds for packet transmitting and/or receiving between the central processing circuit and the main memory, may be used to augment data input and/or data output speeds of the main memory. Further, a memory module having a plurality of memory chips mounted on a printed circuit board (PCB) may be used to augment a memory capacity of the main memory.

The memory module may be classified as single In-line memory module (SIMM) a dual In-line memory module (DIMM). A SIMM may be a memory module having memory chips mounted only on one side of the PCB, whereas, a DIMM may be a memory module having memory chips mounted on both sides of the PCB.

There may be several options for increasing the memory capacity of main memory. Using memory modules may increase memory capacity. Also, increasing memory clock frequencies may enhance memory data access rates, which may cause data transfer rates to change, leading to increased memory capacity. Additionally, the number of memory chips mounted on the memory module and/or the number of slots of motherboard may be increased to provide more memory capacity.

Unfortunately, as a clock frequency of memory is increased, a timing margin of the memory may decrease. Also, if the number of slots of motherboard is increased, then signal transmission of a transmission line may be weakened by generation of load impedance. Registered DIMM, a type of DIMM, may be used to compensate for these signal transmission weaknesses.

FIGS. 1A and 1B illustrate block diagrams showing a conventional registered DIMM and buffered DIMM, respectively.

Referring to FIG. 1A, a registered DIMM may have a phase locked loop (PLL) 103, register 101, and a plurality of memories 105.

When a registered DIMM is mounted on a motherboard, the registered DIMM may compensate for the generation of load impedance. When the motherboard has many slots and/or the clock frequency is high, a reflected wave may be generated, degrading the transmission efficiency. To overcome the degradation of the transmission efficiency, buffered DIMM may be used. The buffered DIMM may have a hub for receiving packets and transforming the packets into a memory command.

Referring to FIG. 1B, a buffered DIMM may have a hub 107 and a plurality of memories 109. The hub 107 may receive packets and provide the packets to the plurality of memories 109 mounted on the memory module with a memory command and data. Furthermore, the hub 107 may packetize data outputted from the memory to supply data to a memory controller in packet form.

FIG. 2A is block diagram that illustrates a testing method of a conventional memory module.

Referring to FIG. 2A, the testing method may use a plurality of memory modules 220-1, 220-2, ..., 220-N and a bus structure suitable for transmission of a packet from one memory module to other memory modules. Furthermore, the bus structure may be positioned between a hub 222 and/or a memory controller 210 for suitable transmission of the packet. A channel of Point-to-Point (P2P) type may be formed between the memory controller 210 and each respective memory module 220-N and then signals may be transferred between the memory controller 210 and the memory modules 220-1, 220-2, ..., 220-N in a daisy chain manner. Therefore, the load impedance of the transmission lines may be reduced.

The packet, which may be received from the memory controller 210, may have an identification code indicative of memory module destination. When the identification code of the received packet matches a particular memory module 220-i, the hub of the particular memory module 220-i may process the received packet and/or may transmit the data to the corresponding memory 224.

Two methods may be used when testing a memory module using automatic test equipment. The first method of testing may be Built-In Self Test (BIST). This method may include preparing testing logic in the hub to test the memory when a specific mode selection signal is applied to the memory module. However, when using BIST, degradation of test coverage due to testing the memory with a fixed test pattern may occur.

The second method of testing may be using a transparent mode. In the transparent mode test, a control signal may be applied to a memory module and signals may be inputted from automatic test equipment. These signals may then be directly inputted into memory. However, since the signals from the test equipment are directly inputted to the memory, a difference may be present between a tab number in the memory module and a tab number required for testing the memory module. Further, when a data comparison is performed in the hub, the data inputted to the memory may be stored in a register. Using a register to perform the data comparison may require a complex circuit and/or may raise difficulty in synchronizing the compared data.

FIG. 2B is a table comparing a tab number of the buffered DIMM with a tab number required for testing the buffered DIMM in a transparent mode.

In a normal mode, signals inputted and outputted from/to the buffered DIMM are all differential signals. A term "northbound" in the table of FIG. 2B indicates a packet that is outputted from the memory controller 210 to be inputted to the buffered DIMM, and a term "southbound" indicates a packet that is outputted from the buffered DIMM to be inputted to the memory controller 210. In addition, a term "primary" indicates a packet inputted to the hub 222 and a term "secondary" indicates a packet outputted from the hub 222.

Referring to FIG. 28, a buffered DIMM in the normal mode may have 14 tabs or pins for a primary northbound (PN) packet, 14 tabs or pins for a complementary primary northbound (/PN), 10 tabs or pins for a primary southbound (PS), 10 tabs or pins for a complementary primary southbound (/PS), 14 tabs or pins for a secondary northbound (SN), 14 tabs or pins for a complementary secondary northbound (/SN), 10 tabs or pins for a secondary southbound (SS) and 10 tabs or pins for a complementary secondary southbound (/SS). For example, the buffered DIMM may have total 96 tabs or pins. However, to test the memory in the transparent mode, several tabs or pins, for example, 8 tabs or pins may be required for memory control signals such as /CS, /RAS, /CAS, /WE, etc. Further, several tabs or pins, for example, 18 tabs or pins may be required for address signals, several tabs or pins, for example, 72 tabs or pins may be required for data (DQ) signals, and several tabs or pins, for example, 18 tabs or pins may be required for data strobe signals (DQS). For example, more tabs or pins are required than the memory module has. In the above example, at least 116 tabs or pins may be required to test the memory in the transparent mode and therefore, in the transparent mode, the memory module may not have enough tabs or pins.

SUMMARY OF THE INVENTION

Accordingly, exemplary embodiments of the present invention may substantially reduce problems due to limitations and/or disadvantages of the related art.

Exemplary embodiments of the present invention may provide a method of testing a memory module by preventing or reducing discrepancies of the number of tabs or pins in a transparent mode.

In some embodiments of the present invention, a method of testing a memory module may include converting a hub of the memory module into a transparent mode, providing first data corresponding to a first address to the hub of the memory module, providing the first data of the hub of the memory module to a first address of a memory; providing first expected data to the hub of the memory module, outputting second data stored at the first address of the memory to the hub of the memory module, and comparing the second data with the first expected data.

In other embodiments of the present invention, the method of testing a memory module may include receiving single ended input signals via differential input terminals through which differential pairs of packet signals are received from a testing equipment, wherein a number of terminals of the testing equipment is different from a number of terminals of the memory module and testing memory chips of the memory module based on the single ended signals.

Exemplary embodiments of the present invention may also provide a hub of memory module for preventing or reducing differences in the number of tabs or pins in a transparent mode.

In other exemplary embodiments of the present invention, a hub of a memory module may include a transparent mode transition circuit configured to receive an input signal, and/or configured to change an operation mode between a normal mode and a transparent mode in response to a transparent mode enable signal, a signal processing circuit configured to process an output signal of the transparent mode transition circuit when the transparent mode transition operates in the normal mode, and a data comparison circuit configured to receive a data signal from the transparent mode transition circuit to determine whether a malfunction of a memory occurs by using received data signals.

Exemplary embodiments of the present invention may also provide a data comparator of a hub of a memory module including a data selector receiving a data selection signal and a data signal and providing the data signal to a memory of the memory module if the data selection signal indicates the data signal is a data write signal and a comparator receiving the data signal from the data selector and data output from the memory of the memory module if the data selection signal indicates the data signal is a expected data signal.

Exemplary embodiments of the present invention may also provide a method of comparing data in a hub of a memory module including receiving a data selection signal and a data signal, providing the data signal to a memory of the memory module if the data selection signal indicates the data signal is a data write signal, receiving the data signal from the data selector and data output from the memory of the memory module if the data selection signal indicates the data signal is a expected data signal, and comparing the data signal from the data selector and data output from the memory of the memory module.

Exemplary embodiments of the present invention may also provide a memory module including p memory chips, a differential input circuit configured to receive differential pairs of packet signals through input terminals in a first mode in response to a mode control signal, a single ended input circuit configured to receive single ended input signals through the input terminals in a second mode in response to the mode control signal, a signal processing circuit configured to decode the differential pairs of packet signals outputted from the differential input circuit to control the memory chips in the first mode, and a test circuit configured to test the memory chips based on the single ended input signals received at the single ended input circuit.

Exemplary embodiments of the present invention may also provide a semiconductor chip module including a pair of differential input terminals through which input signal are received, a differential input circuit configured to generate a differential signal in a first mode based on the input signals received by the pair of differential input terminals, and a single-ended input circuit configured to produce two single ended signals in a second mode based on the input signals received from the pair of differential input terminals.

BRIEF DESCRIPTION OF THE DRAWINGS

The present invention will become more apparent by describing in detail the exemplary embodiments thereof with reference to the accompanying drawings, in which:

FIG. 15 is a schematic view illustrating a comparison operation of the memory module according to an exemplary embodiment of the present invention.

DESCRIPTION OF EXEMPLARY EMBODIMENTS

Hereinafter, exemplary embodiments of the present invention will be described in detail with reference to the accompanying drawings.

A testing memory module of an exemplary embodiment of the present invention may perform direct testing using testing equipment without applying a packet to a memory module. A hub of the memory module may generate a command and/or data needed for the memory to operate in transparent mode instead of processing a packet of the hub to obtain command and data signals.

Figure 3:
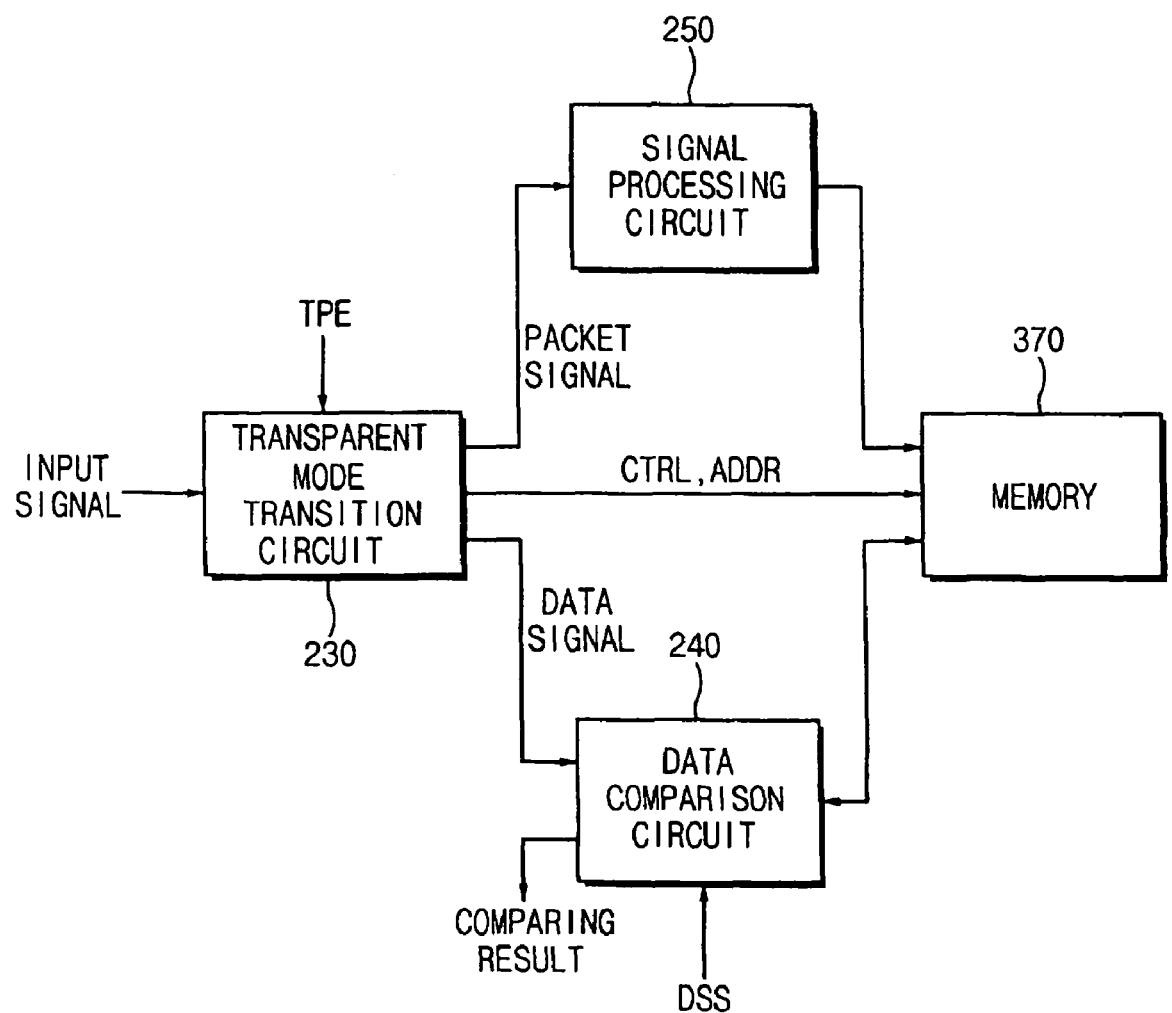
FIG. 3 is a block diagram illustrating a memory module of an exemplary embodiment of the present invention.

FIG. 3 is a block diagram illustrating the memory module of an exemplary embodiment of the present invention.

Referring to FIG. 3, the hub 222 of memory module may include a transparent mode transition circuit 230, a data comparison circuit 240, and a signal processing circuit 250.

The transparent mode transition circuit 230 may operate in normal mode or transparent mode according to a transparent mode enable signal (TPE). The normal mode of the exemplary embodiment may indicate that the packet may have been introduced to the memory module and/or may have been transformed into a memory control signal, an address signal, and/or a data signal by processing a packet of the signal processing circuit 230. Furthermore, the transparent mode of an example embodiment may indicate that testing equipment may apply the memory control signal, the address signal, and the data signal, required for testing the memory directly to the memory 370.

Accordingly, an input packet signal may be outputted from the transparent mode transition circuit 230, and may be received by the signal processing circuit 250 in the normal mode. In the transparent mode, an Input signal may be outputted from the transparent mode transition circuit 230 to the memory 370 and/or to the data comparison circuit 240. The signal processing circuit 250 does not operate in the transparent mode. In the transparent mode, a memory control signal CTRL and/or the address signal ADDR may be provided to the memory 370, and the data signal DATA SIGNAL may be provided to the data comparison circuit 240. In the transparent mode, the memory module may have too few tabs or pins so the amount of data provided to the data comparison circuit 240 from the testing equipment may be smaller than the amount of data that written to the memory 370.

The data comparison circuit 240 may receive the data signal DATA SIGNAL and may transmit the data signal DATA SIGNAL to the memory 370 in the transparent mode. Furthermore, the data comparison circuit 240 may receive output data of the memory 370. The data from the memory 370 may be tested by comparing the output data of the memory 370 and/or expected data inputted from the testing equipment. The data comparison circuit 240 may transmit the input signal to the memory 370 and/or may perform the data comparison according to a data selection signal (DSS).

When the data selection signal DSS indicates that inputted data signal may be the input data provided to the memory 370, the inputted data signal may be provided to the memory 370. Conversely, when the data selection signal indicates that the inputted data signal may be the expected data, the data signal may be compared with output data of the memory 370.

In the normal mode operation, the transparent mode transition circuit 230 and the signal processing circuit 250 may receive the packet and may provide the memory control signal CTRL, the address signal ADDR, and the data signal to the memory 370.

Figure 4:
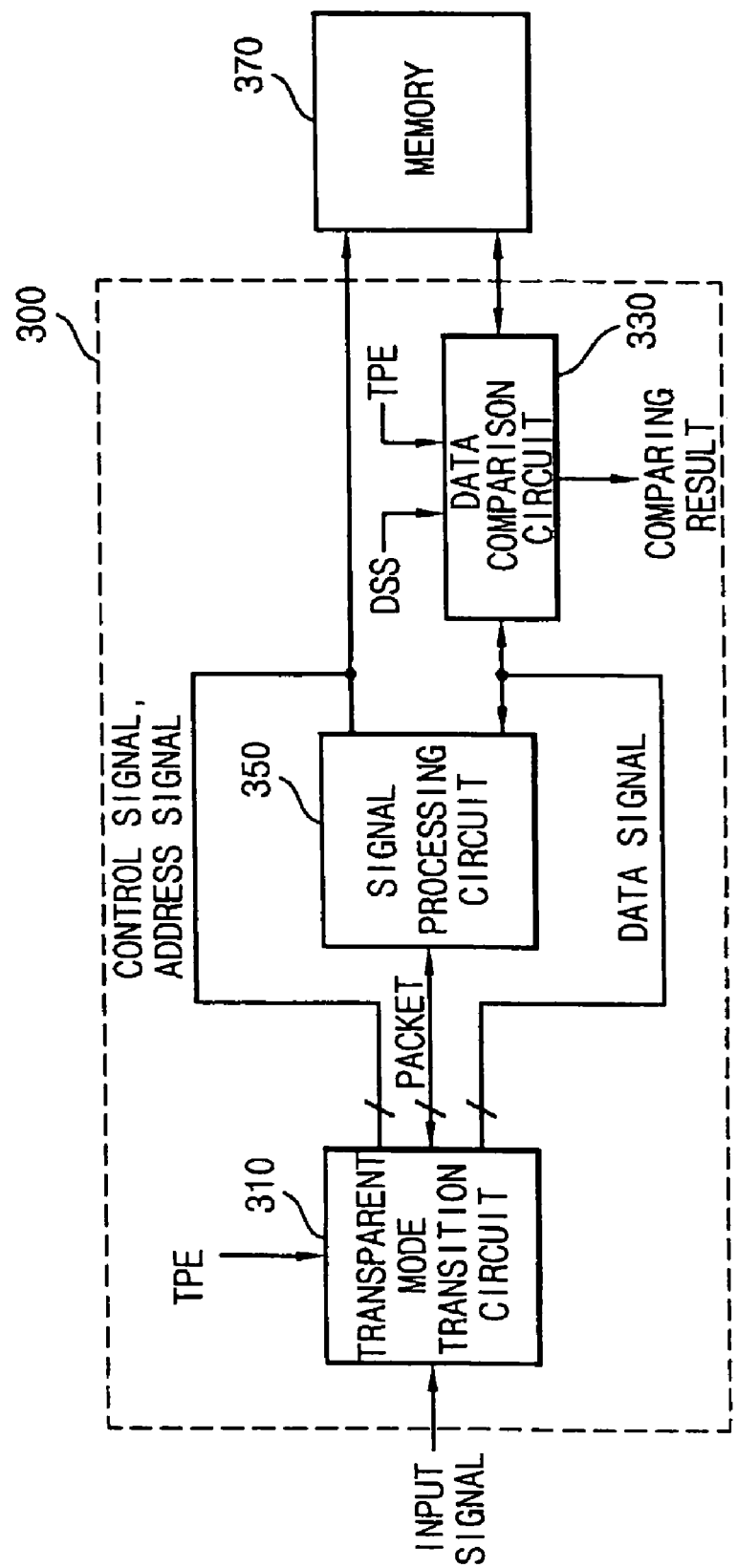
FIG. 4 is a block diagram illustrating a memory module according to another exemplary embodiment of the present invention.

FIG. 4 is a block diagram illustrating a memory module according to another exemplary embodiment of the present invention.

In FIG. 4, the data comparison circuit 330 may receive the packet from the transparent mode transition circuit 310 in the normal mode.

During a write-in operation of the normal mode, the signal processing circuit 350 transforms the packet outputted from the transparent mode transition circuit 310 into a memory control signal CONTROL SIGNAL, an address signal ADDRESS SIGNAL, and/or a data signal DATA SIGNAL to transmit the memory control signal CONTROL SIGNAL, the address signal ADDRESS SIGNAL, and/or the data signal DATA SIGNAL to the data comparison circuit 330 and the memory 370.

During a read-out operation of the normal mode, the packet outputted from the transparent mode transition circuit 310 is transformed into the memory control signal CONTROL SIGNAL and the address signal ADDRESS SIGNAL and provided to the memory 370. Data read from the memory 370 are received by the data comparison circuit 330 to be packetized by the signal processing circuit 350 and transferred to the transparent mode transition circuit 310.

The data comparison circuit 330 transmits the data outputted from the signal processing circuit 350 to the memory 370 during the write-in operation of the normal mode and transmits the data from the memory 370 to the signal processing circuit 350 during the read-out operation of the normal mode.

During a write-in operation in the transparent mode, the data comparison circuit 330 may receive the data signal outputted from the testing equipment through the transparent mode transition circuit 310. The data signal may be multiplied and transmitted to the memory 370 to be written the memory 370.

During a read-out operation in the transparent mode, the data comparison circuit 330 may receive the data read from the memory 370 and compare the read data with expected data provided from the testing equipment. The data comparison circuit 330 operates under the control of the data selection signal (DSS) and the transparent mode enable signal (TPE). The amount of data provided to the data comparison circuit 330 from the testing equipment may be less than the amount of the data actually written to the memory 370.

Figure 5:
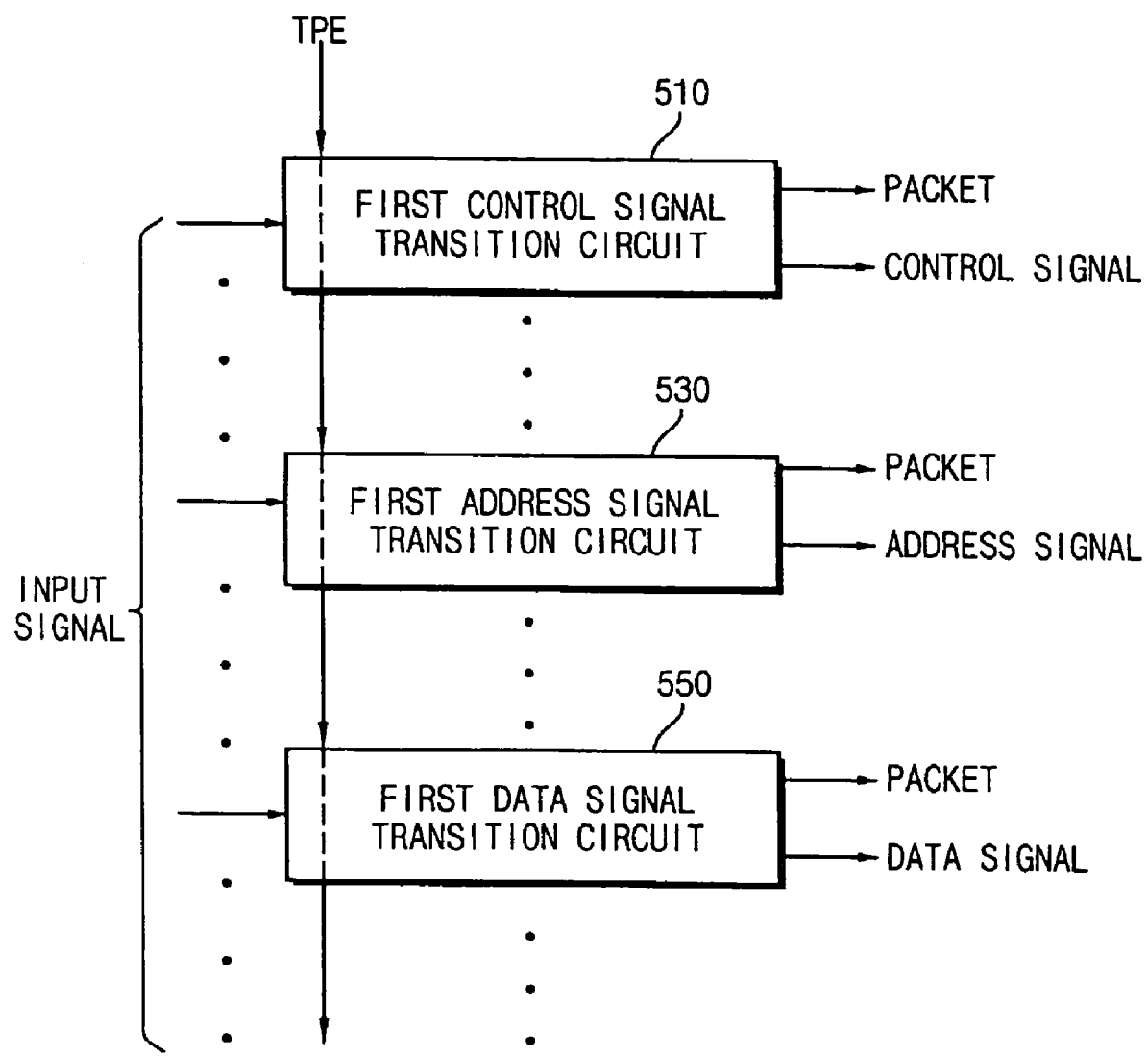
FIG. 5 is a block diagram showing a transparent mode transition circuit of an exemplary embodiment of the present invention.

FIG. 5 is a block diagram illustrating a transparent mode transition circuit, for example, transparent mode transition circuit 310 of FIG. 4, according to an exemplary embodiment of the present invention.

Referring to FIG. 5, the transparent mode transition circuit 310 may have at least one control signal transition circuit, at least one address signal transition circuit, and at least one data signal transition circuit 550, which are responsive to the transparent mode enable signal (TPE).

A first control signal transition circuit 510 may receive the input signal INPUT SIGNAL and may transmit the input signal INPUT SIGNAL that is outputted from the testing equipment to a pin of a tab of the memory 370 and/or the signal processing circuit 350. When the control signal CONTROL SIGNAL is inputted from the testing equipment, the first control signal transition circuit 510 may operate in the transparent mode and/or may apply the control signal CONTROL SIGNAL to the memory 370. For example, a number of control signal transition circuits 510-1, 510-2, . . . , 510-N may be varied depending upon a number of control signals.

A first address signal transition circuit 530 may receive the input signal INPUT SIGNAL and may transmit the input signal INPUT SIGNAL that is outputted from the testing equipment to a tab into the memory 370 and/or the signal processing circuit 350. If the memory control signal CONTROL SIGNAL is inputted from the testing equipment, then the first address signal transition circuit 530 may operate in the transparent mode and may apply the address signal ADDRESS SIGNAL to the memory 370. For example, a number of the address signal transition circuits 530-1, 530-2, . . . , 530-N may be controlled by a number of address signals.

A first data signal transition circuit 550 may receive the input signal INPUT SIGNAL and/or may transmit the input signal INPUT SIGNAL that is inputted from the testing equipment to the tab into the memory 370 and/or the signal processing circuit 350. If the data signal DATA SIGNAL is inputted from the testing equipment, then the first data signal transition circuit 550 may operate in the transparent mode and may apply the data signal DATA SIGNAL to the data comparison circuit 330. For example, a number of the data signal transition circuits 550-1, 550-2, . . . , 550-N may be controlled by a number of data signals.

Figure 6:
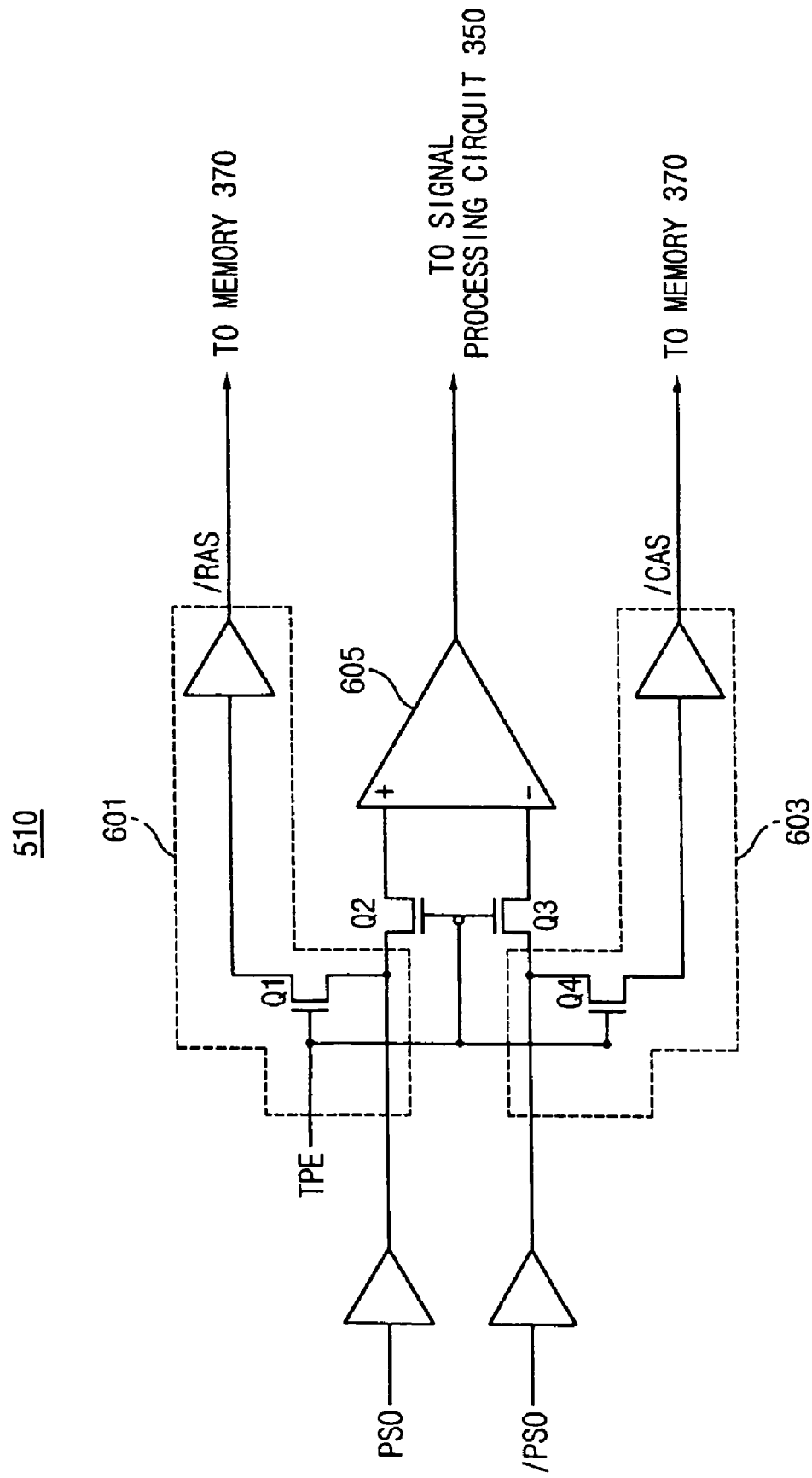
FIG. 6 is a circuit diagram illustrating a control signal transition circuit according to an exemplary embodiment of the present invention.

FIG. 6 illustrates a circuit diagram of a control signal transition circuit, for example, first control signal transition circuit 510 of FIG. 5, according to an exemplary embodiment of the present invention.

Referring to FIG. 6, the control signal transition circuit 510 may have a first control signal path 601, a second control signal path 603, and a differential amplifier 605.

In the transparent mode, a row address strobe (/RAS) signal may be inputted via a PS0 pin disposed at the tab of the memory module and a column address strobe (/CAS) signal may be inputted via a /PS0 pin. The /RAS signal and the /CAS signal may be directly inputted from the testing equipment. Furthermore, transistors Q1 and Q4 may be turned on by the transparent mode enable (TPE) signal in the transparent mode. The control signal transition circuit 510 may start operation of the transparent mode in response to the activation of the transistors Q1 and Q4.

The /RAS signal may be provided to the memory 370 via the transistor Q1 and the /CAS signal may be provided to the memory 370 via the transistor Q4. The /RAS signal, which may be the control signal of the memory 370, may be inputted from the testing equipment and may be provided to the memory 370 via the transistor Q1 that forms the first control signal path 601. The /CAS signal, which may be another control signal of the memory 370, may be inputted from the testing equipment and may be provided to the memory 370 via the transistor Q4 that forms the second control signal path 603.

If the packet is provided to the PS0 pin and the /PS0 pin, then the control signal transition circuit 510 may operate in the normal mode. The differential amplifier 605 may start operation in response to the turning-on of transistors Q2 and Q3 and an output of the differential amplifier 605 may be provided to the signal processing circuit 350.

Although not shown in the figures, exemplary embodiments of the present invention may include address signal transition circuit(s) 530 and/or data signal transition circuit(s) 550, which have the same or similar circuitry as circuitry of the control signal transition circuit 510 shown in FIG. 6. However, a configuration of the tabs or pins connected to input terminals of the address signal transition circuit(s) 530 and the data signal transition circuit(s) 550 may be different from that of the control signal transition circuit 510. Also, an output of the data signal transition circuit 550 may be provided to the data comparison circuit 330 in the transparent mode and may be provided to the signal processing circuit 350 in the normal mode.

Figure 7:
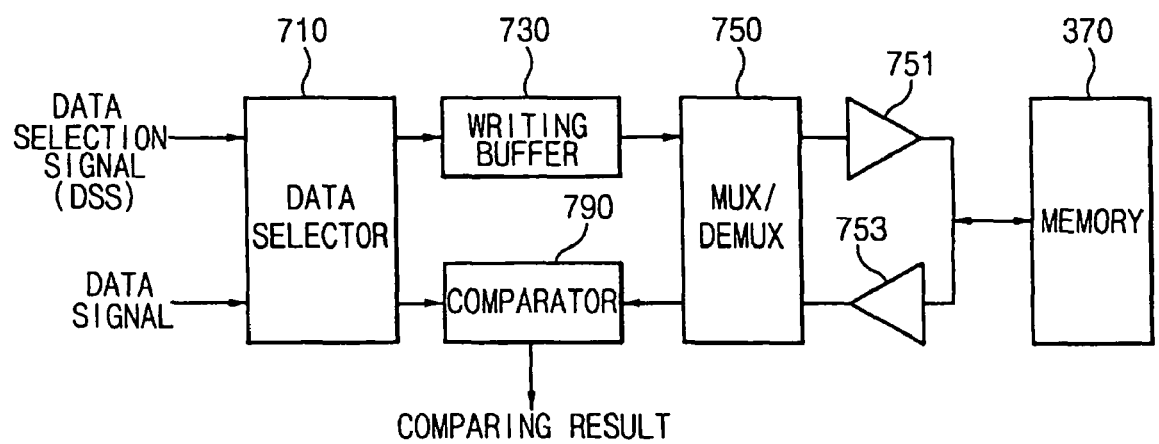
FIG. 7 is a block diagram illustrating a data comparison circuit according to an exemplary embodiment of the present invention.

FIG. 7 illustrates a block diagram of a data comparison circuit, for example, data comparison circuit 330 of FIG. 4, according to an exemplary embodiment of the present invention.

Referring to FIG. 7, the data comparison circuit 330 may include a data selector 710, a writing buffer 730, a comparator 790, and a mux/demux 750.

The data selector 710 may provide the data signal DATA SIGNAL to the writing buffer 730 and/or the comparator 790 in response to a data selection signal DSS. If the data signal DATA SIGNAL is designated as a writing data signal provided to the memory 370 in response to the data selection signal DSS, the data selector 710 may output the writing data signal to the writing buffer 730. The writing data signal may be provided to the writing buffer 730 after a time delay, outputted to the mux/demux 750, and/or provided from the mux/demux 750 to the memory 370.

When the data signal DATA SIGNAL is determined to be expected data signal compared with a data outputted from the memory 370 in response to the data selection signal, the data selector 710 may output the expected data signal to the comparator 790, namely, the expected data signal may be provided to the comparator 790 via a second data comparison path comprised of the data selector 710 and/or the comparator 790.

When the expected data signal provided to the data selector 710 is compared with the output data of the memory 770, the output data of the memory 370 may be provided to the comparator 790 via the mux/demux 750. For example, the output data of the memory 370 may be provided to the comparator 790 via a first data comparison path comprised of the mux/demux 750 and/or the comparator 790. A comparing result of the comparator 790 may be outputted to testing equipment.

The comparator 790 may perform the testing operation in which the data may pass or fail, which may be determined by comparing the output data of the memory 370 stored in a memory address with the expected data.

Figure 8:
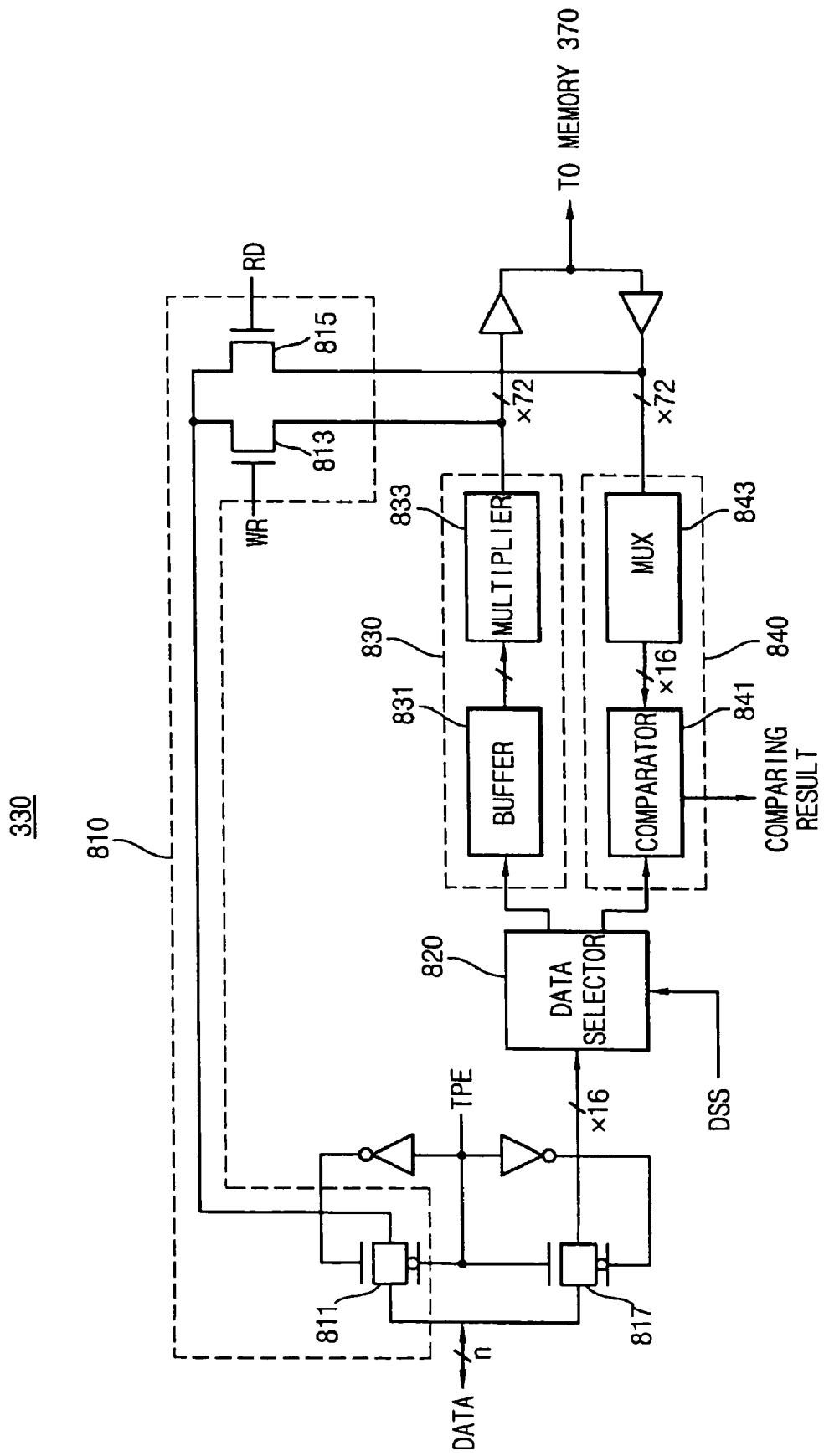
FIG. 8 is a block diagram illustrating a data comparison circuit according to another exemplary embodiment of the present invention.

FIG. 8 is a block diagram illustrating a data comparison circuit, for example, data comparison circuit 330 of FIG. 4, according to another exemplary embodiment of the present invention.

Referring to FIG. 8, the data comparison circuit 330 may include a normal data path 810, a data selector 820, a writing path 830 and a comparison path 840. The transparent mode enable signal (TPE) may be designated to have a non-active state (for example, a logic low level) in the normal mode and an active state (for example, a logic high level) in the transparent mode.

The normal data path 810 may include a switch 811 controlled by the TPE signal, a switch 813 controlled by a write signal (WR) and a switch 815 controlled by a read signal (RD). During a write-in operation of the normal mode, data DATA inputted from the signal processing circuit 350 is transferred to the memory 370 via the switch 811 and the switch 813. During a read-out operation of the normal mode, data outputted from the memory 370 is transferred to the signal processing circuit 350 via the switch 815 and the switch 811. In the transparent mode, the TPE signal may have a logic high level, so that the data is not transferred via the normal data path 810.

In the normal mode, a switch 817 is turned off in response to the non-active status of the TPE signal so that the data are not transferred to the data selector 820. In the transparent mode, the switch 817 is turned on in response to the active status of the TPE signal and the data are transferred from the transparent mode transition circuit 310 to the data selector 820. The data are then transferred to the writing path 830 or the comparison path 840 based on the data selection signal (DSS). Namely, the data selector 820 transfers the data to the writing path 830 during a write-in operation of the transparent mode and transfers the data to the comparison path 840 during a read-out operation of the transparent mode, responsive to the DSS signal.

The writing path 830 may include a buffer 831 and a multiplier 833. The buffer 831 buffers the data transferred from the data selector 820 to transfer the data to the multiplier 833. The multiplier 833 multiplies the data to generate multiple data groups and transmits the multiple data groups to respective memories, for example, specific DRAMs that make up memory 370. The multiple data groups have increased amount of data compared with the data transferred from the data selector 820. In the writing path 830, a small amount of data received by the tab of the memory module from the testing equipment may be multiplied and written to the memory 370. The data may be written concurrently to multiple memories.

The comparison path 840 may include a comparator 841 and a multiplexer 843. The comparison path 840 may be activated in a read-out operation of the transparent mode. The comparator 841 receives expected data from the transparent mode transition circuit 310 through the data selector 820 based on the TPE signal and the DSS signal. The multiplexer 843 receives a number of data read from the memory 370 during the read-out operation of the transparent mode and transmits the read data to the comparator 841 so that the data may be compared to the expected data. The comparator 841 compares the expected data with the data outputted from the multiplexer 843 to generate the comparing result and provides the comparing transparent mode transition circuit 310 to the data selector 820. The data are then transferred to the writing path 830 or the comparison path 840 based on the data selection signal (DSS). Namely, the data selector 820 transfers the data to the writing path 830 during a write-in operation of the transparent mode and transfers the data to the comparison path 840 during a read-out operation of the transparent mode, responsive to the DSS signal.

The writing path 830 may include a buffer 831 and a multiplier 833. The buffer 831 buffers the data transferred from the data selector 820 to transfer the data to the multiplier 833. The multiplier 833 multiplies the data to generate multiple data groups and transmits the multiple data groups to respective memories, for example, specific DRAMs that make up memory 370. The multiple data groups have increased amount of data compared with the data transferred from the data selector 820. In the writing path 830, a small amount of data received by the tab of the memory module from the testing equipment may be multiplied and written to the memory 370. The data may be written concurrently to multiple memories.

The comparison path 840 may include a comparator 841 and a multiplexer 843. The comparison path 840 may be activated in a read-out operation of the transparent mode. The comparator 841 receives expected data from the transparent mode transition circuit 310 through the data selector 820 based on the TPE signal and the DSS signal. The multiplexer 843 receives a number of data read from the memory 370 during the read-out operation of the transparent mode and transmits the read data to the comparator 841 so that the data may be compared to the expected data. The comparator 841 compares the expected data with the data outputted from the multiplexer 843 to generate the comparing result and provides the comparing result to the testing equipment.

In other words, a small amount of expected data may be outputted from the testing equipment to the tab of the memory module to be inputted to the hub, and the expected data may be compared with a large amount of data read from the memory 370 by the comparator 841 to determine whether the memory 370 has defects. Thus, the large amount of data of the memory is not directly inputted to the tab of the memory module when the transparent mode is used. Therefore, a problem caused by a shortage of tabs may be solved.

Figure 9:
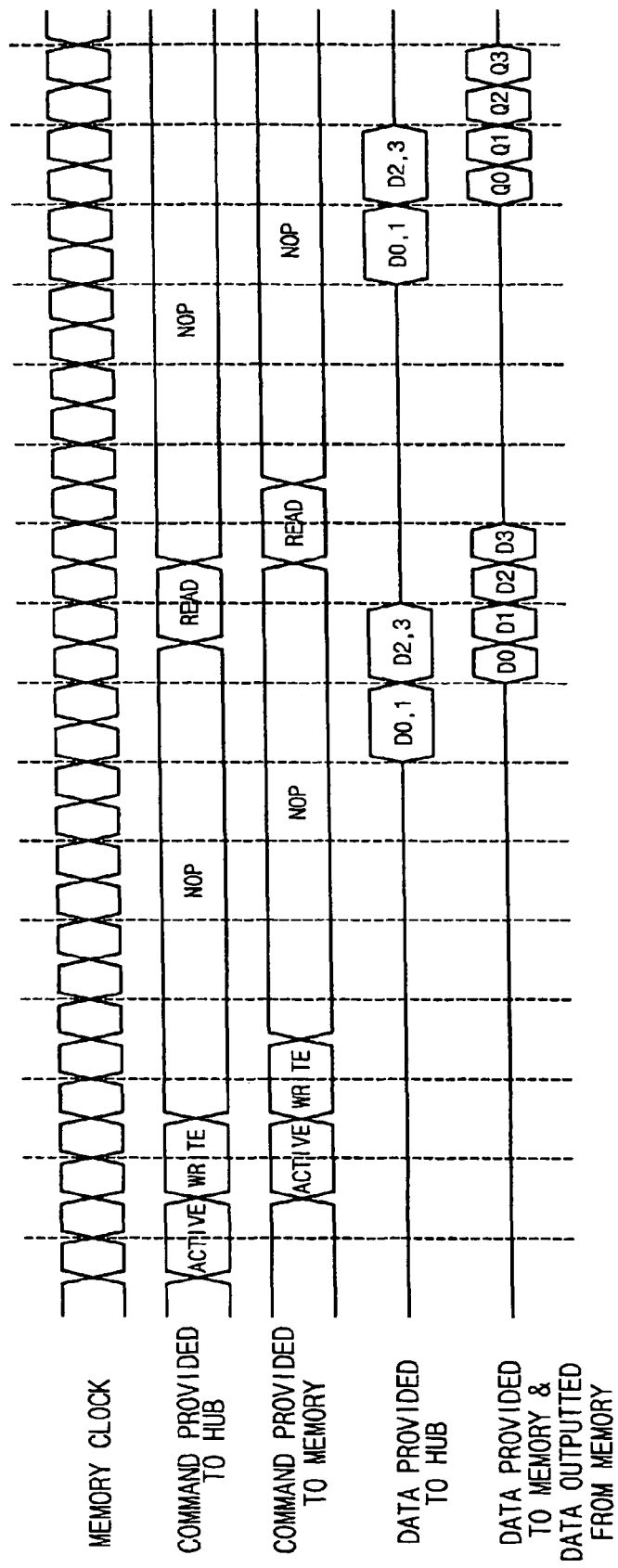
FIG. 9 is a timing diagram illustrating an operation of the data comparison circuit of FIG. 7 according to an exemplary embodiment of the present invention.

FIG. 9 illustrating a timing diagram showing an operation of a data comparison circuit, for example the data comparison circuit of FIG. 7, according to an exemplary embodiment of the present invention.

Referring to FIG. 9, a memory clock may be provided to the memory 370 via a clock supplying line and an input command synchronized with the memory clock may be provided to a hub. The input command provided to the hub having a time delay may be synchronized with the memory clock and provided to the memory 370. The input command applied to the memory 370 may be delayed by 1 period of the memory clock.

Data may be provided to the hub in response to the memory command applied to the memory. Data D0, D1, D2, and D3 may be provided to the memory 370 by a writing command applied to the memory 370. After the data D0, D1, D2, and D3 are transformed into data D0, D1, D2 and D3, the data D0, D1, D2 and D3 may be provided to the memory 370 via the writing buffer 730 and/or the mux/demux 750. Furthermore, output data Q0, Q1, Q2 and Q3 stored in addresses of the data D0, D1, D2 and D3 may be outputted from the memory 370. The data Q0, Q1, Q2 and Q3 may be provided to the comparator 790 via the mux/demux 750 and the data D0, D1, D2, and D3 may be provided to the comparator 790 via the data selector 710 after 1 clock delay. The comparator 790 may compare D0, D1, D2 and D3 with Q0, Q1, Q2 and Q3, respectively. A comparing result COMPARING RESULT between data D0, D1, D2 and D3, and data Q0, Q1, Q2 and Q3 may be outputted from the comparator 790 to the testing equipment.

Figure 10:
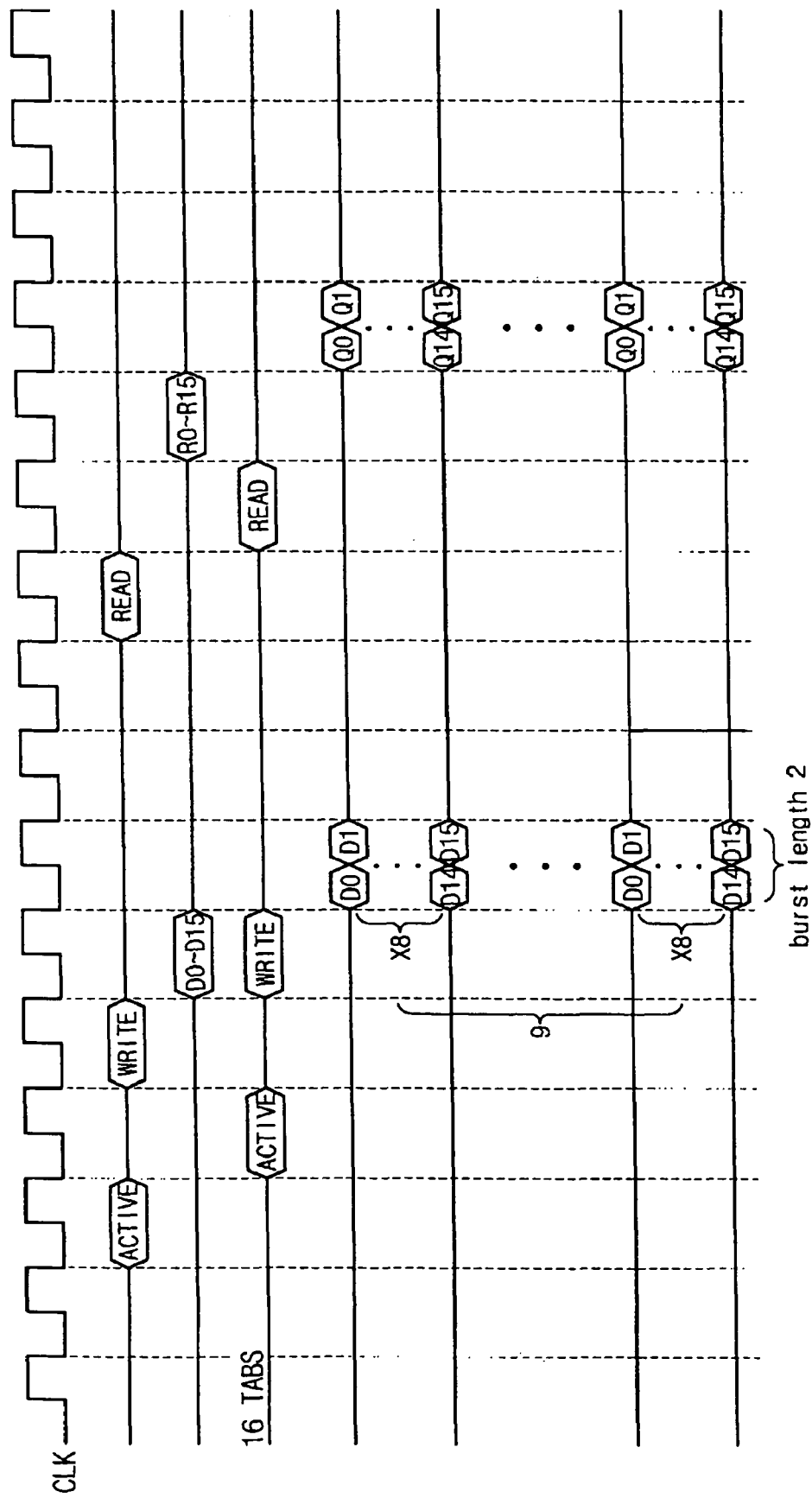
FIG. 10 is a timing diagram illustrating an operation of the data comparison circuit of FIG. 8 according to another exemplary embodiment of the present invention.

FIG. 10 is a timing diagram illustrating an operation of a data comparison circuit, for example the data comparison circuit of FIG. 8, according to another exemplary embodiment of the present invention.

In FIG. 10, it is assumed that the memory module 370 includes nine 'x8' memories and a burst length of the memories is designated as 'two' in the transparent mode. In addition, the memory command is transferred between the testing equipment and the hub of the memory module 370 in the transparent mode.

With reference to the figures described above and FIG. 7, a memory clock is applied to the memory 370 through a clock supplying line of the memory module.

First, an active command is applied to the transparent mode transition circuit 310 of the hub. The active command is delayed by 1 clock cycle to be directly applied to the memory 370. After a time delay, a write command is inputted from the testing equipment to the transparent mode transition circuit 310. The write command is delayed by 1 clock cycle to be directly applied to the memory 370. In response to the write command, 16-bit wide (x16) write data D0~D5 are applied to the transparent mode transition circuit 310 through 16 tabs or pins of the memory module 370. The inputted write data are transferred from the data selector 820 to the multiplier 833 via the buffer 831 based on the data selection signal.

The x16 write data D0-D15 may be transformed to X8 data (D0D1, D2D3, . . . , and D14D15) each having a burst length of 2 by the multiplier 833 and the transformed data is duplicated by nine times so that the write data having 144 (=16×9) bits are produced. Then 16-bit data as the original write data are applied to respective memories, for example, respective nine memories.

In addition, a read command is applied to the transparent mode transition circuit 310 of the hub. In response to the read command, expected data R0~R15 are inputted from the testing equipment to the transparent mode transition circuit 310 through 16 tabs or pins of the memory module. The expected data R0~R15 are transmitted to the data selector 820 of the data comparison circuit 330 based on the TPE signal and transmitted to the comparator 841 based on the DSS signal.

In addition, the read command is delayed by 1 clock cycle to be directly applied to the memory 370, and after a time delay, 8-bit (X8) data having the burst length of 2 are outputted from respective memories, namely, total 144-bit data are read from the memories. The read data are inputted to the multiplexer 843 and the read data sequentially selected by the multiplexer 843 are provided to the comparator 841. The comparator 841 compares the read data with the expected data to generate the comparing result COMPARING RESULT. The comparing result COMPARING RESULT is outputted to the testing equipment.

Figure 11:
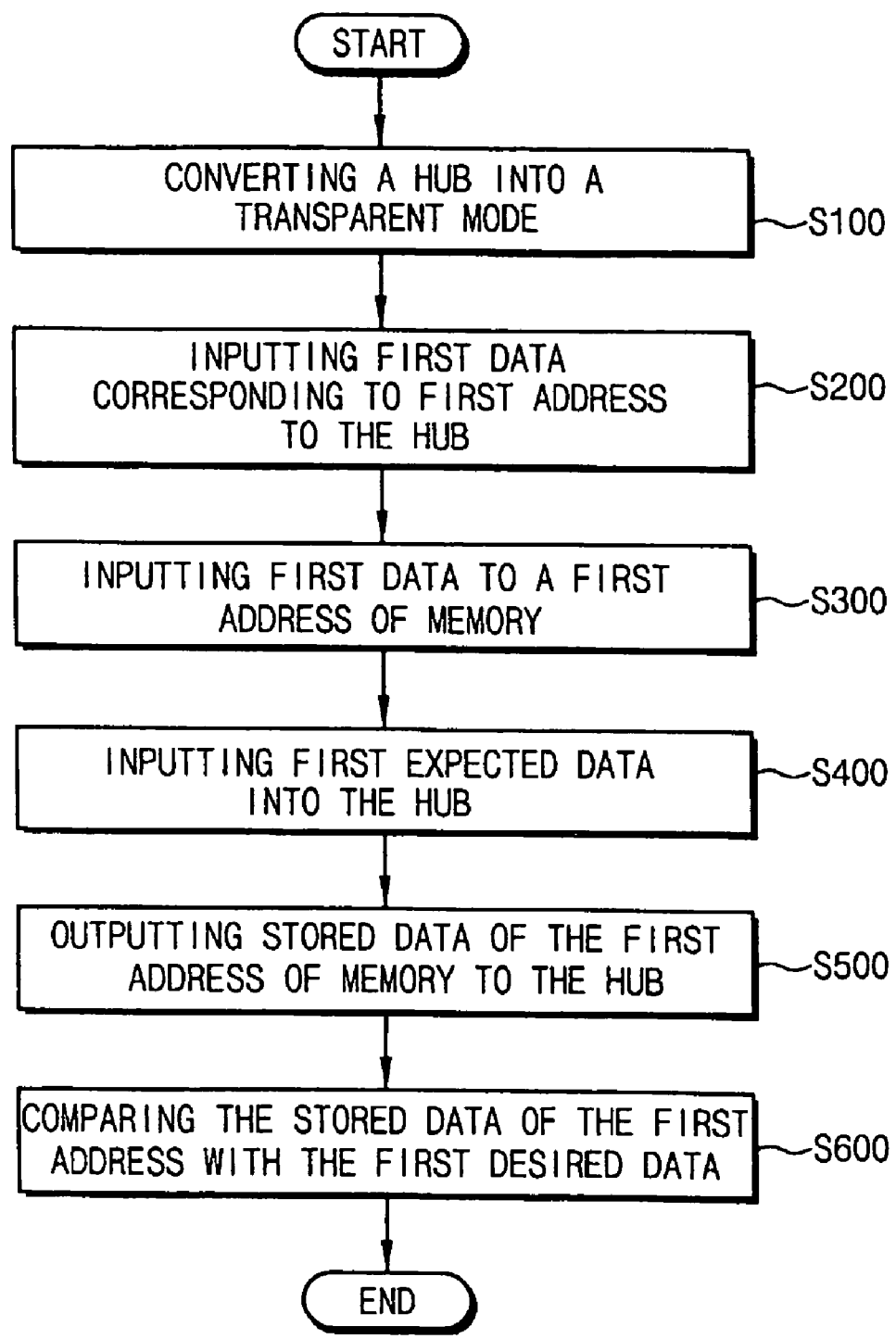
FIG. 11 is a flow chart illustrating testing method of the memory module according to an exemplary embodiment of the present invention.

FIG. 11 is flow chart illustrating a testing method of the memory module according to an exemplary embodiment of the present invention.

Referring to FIG. 11, the hub of the memory module may be converted into the transparent mode (S100). The conversion into the transparent mode may be performed by applying the transparent mode enable (TPE) signal to the hub. As illustrated in FIG. 5 and FIG. 6, a transparent mode transition circuit 310, 510 may have a control signal path, an address path, and/or a data signal path according to the transparent mode enable (TPE) signal.

Furthermore, a first data signal corresponding to a first address may be applied to the hub in the transparent mode (S200). The memory control signal, which may be included in the memory command may be provided to the control signal path, the first address signal may be applied to the address signal path, and/or the first data signal may be applied to the data selection circuit of the data signal path. Furthermore, the first data signal, which may be provided to a data selection circuit, may be transmitted to the write buffer by the data selection signal.

Furthermore, the first data signal, which may be applied to the hub, may be inputted to the first address of the memory (S300). Accordingly, the first data signal of the writing path may be inputted to the memory. The first data signal may have a smaller amount of data than an amount of data that are actually written to the memory. Therefore, the first data signal may be multiplied by a multiplier of the hub, for example, multiplier 833, and the multiplied data signal may be inputted to the memory.

Furthermore, the first expected data signal may be provided to the hub (S400). The first expected data signal may be the same as the first data signal and may be directly outputted from the testing equipment. The first expected data signal may be provided to the data comparison circuit via the data signal path of the hub in the transparent mode. The data comparison circuit may determine whether the first expected data signal may have been provided to the memory. Accordingly, the first expected data signal may be transmitted to a second data comparison path.

Furthermore, a data stored in the first address of the memory may be outputted to the hub (S500). An output of the data stored in the memory may be performed by applying the memory control signal required for memory reading operation and/or by applying the first address signal to the memory. Data of the first address outputted from the memory may be transmitted into a second data selection path of the data comparison circuit.

To the extent possible S100-S600 may be performed in any order. In particular, in example embodiments, applying the first expected data signal to the hub (S400) and outputting the data stored in the first address of the memory (S500) may be reversed.

The data comparison circuit may compare the data outputted from the first address of the memory with the first expected data (S600). Furthermore, the comparing result of two data may be outputted to the testing equipment.

Figure 12:
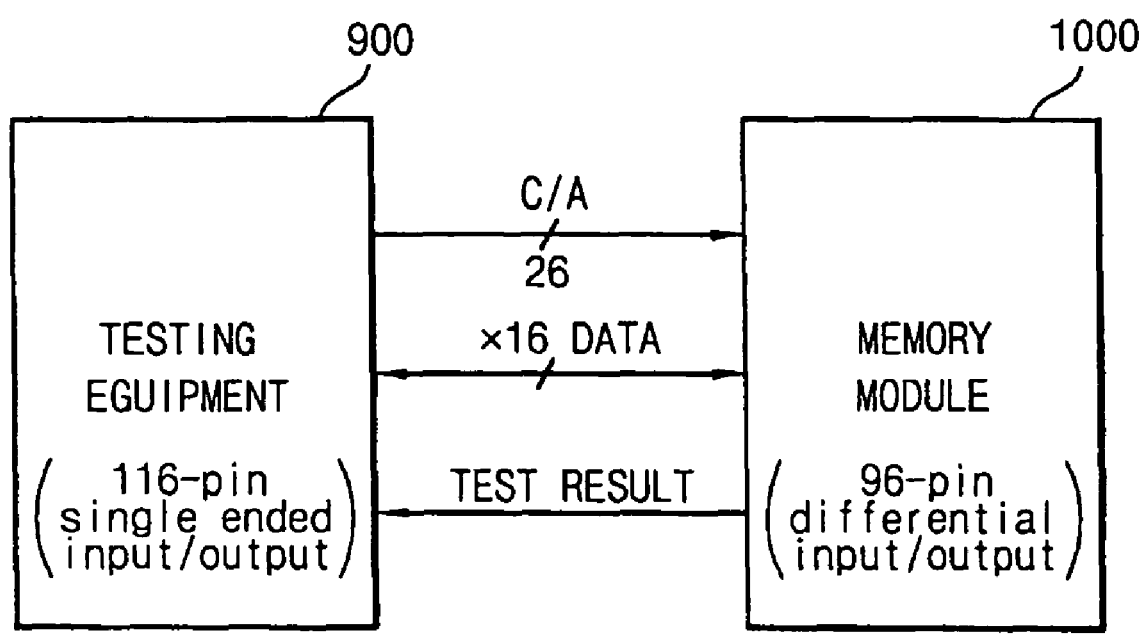
FIG. 12 is a block diagram illustrating a testing operation of a buffered DIMM of the present invention with conventional testing equipment according to an exemplary embodiment of the present invention.

FIG. 12 is a block diagram illustrating a testing operation of a buffered DIMM with a conventional testing equipment according to an exemplary embodiment of the present invention.

Referring to FIG. 12, the conventional testing equipment 900 may have 26 taps (8 commands and 16 addresses) and 90 taps (72 DQ and 18 DQS), for example, a total of 116 single-ended input and output terminals, and also, a total of 116 tabs or pins.

Figure 1A:
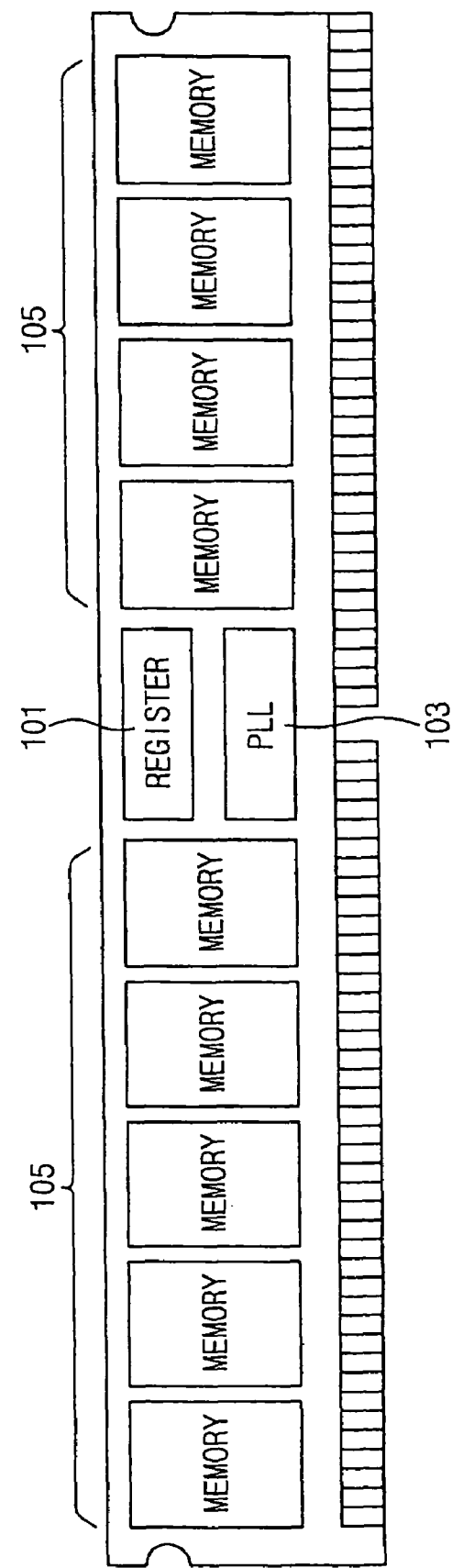
FIGS. 1A and 1B are block diagrams illustrating conventional Registered DIMM and Buffered DIMM.
Figure 1B:
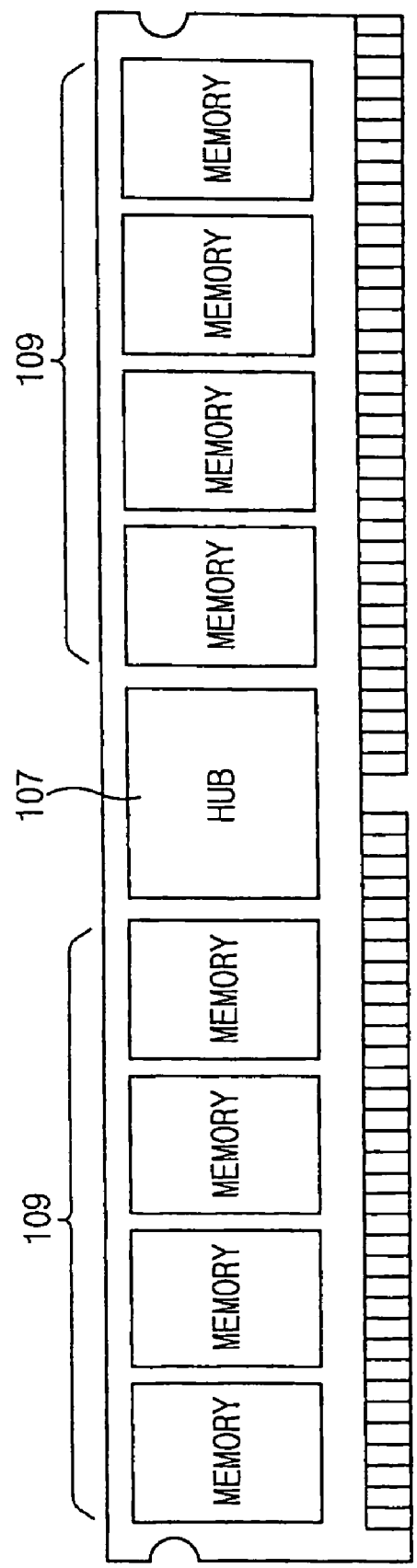
Figures 2A, 2B:
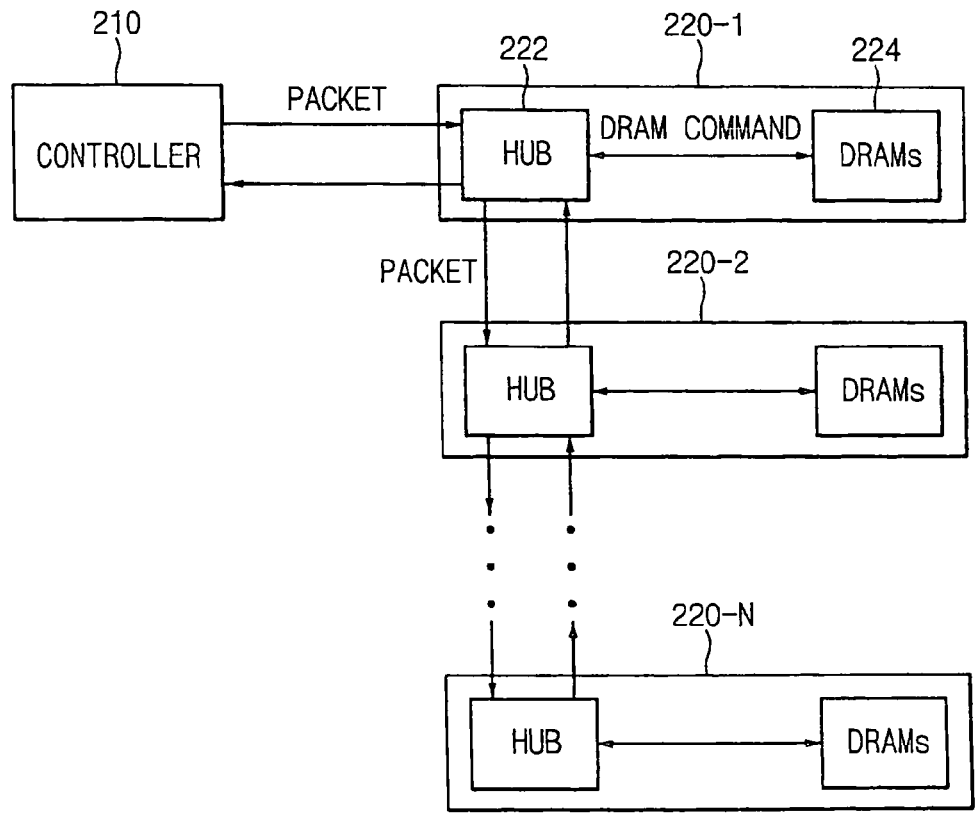
FIG. 2A is a block diagram illustrating a testing method of conventional memory module.
FIG. 2B is a table illustrating a number of tabs in a buffered DIMM and a number of tabs required for testing the memory.

The memory module 1000 (e.g., buffered DIMM) of an exemplary embodiment of the present invention, as described in FIG. 2B, may have 48 pairs of terminals for receiving differential input signals, i.e. 96 differential input/output terminals (for a total of 98 input and output terminals).

According to exemplary embodiments of the present invention, 16-bit test data may be transferred from the testing equipment 900 to the buffered DIMM 1000 through 16 of 72 data lines. Control signals and address signals (C/A) may be provided to the buffered DIMM 1000 in a manner similar to that of the conventional art.

Therefore, 8 control signal lines, for example, /CS, /RAS, /CAS, /WE, CKE, ODT, etc., and 18 address lines, for a total of 26 C/A lines may be used and 16 data lines may be used to test the memory module 1000.

The buffered DIMM 1000 may be connected to the testing equipment 900 through 48, for example, 14 pairs of primary northbound terminals and 10 pairs of secondary southbound terminals. 42 terminals among the 48 terminals may be connected to the 26 C/A lines and 16 data lines.

Figure 13:
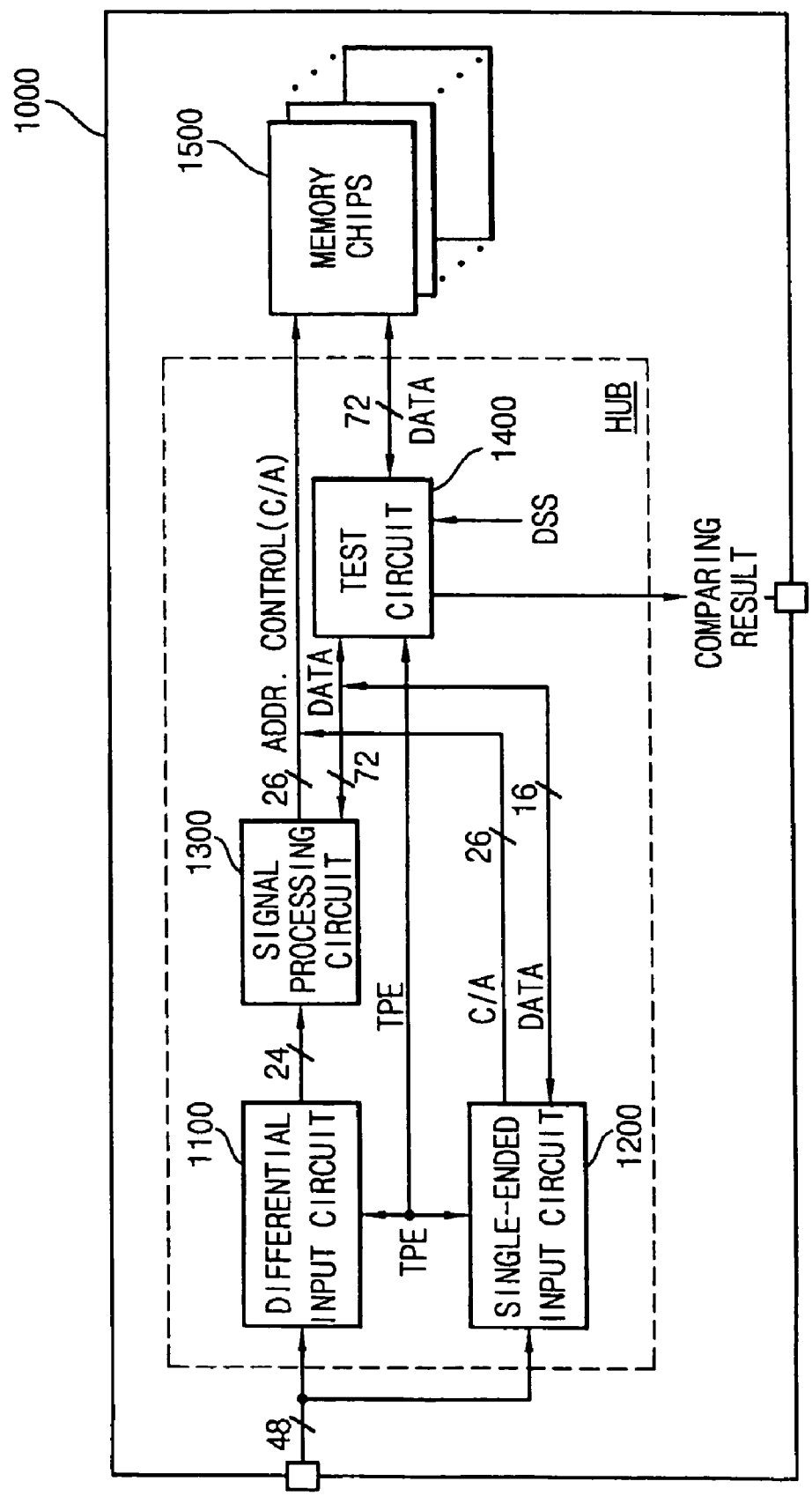
FIG. 13 is a block diagram illustrating a buffered DIMM according to an exemplary embodiment of the present invention.

FIG. 13 is a block diagram illustrating a buffered DIMM according to an exemplary embodiment of the present invention.

Referring to FIG. 13, the buffer DIMM may include a differential input circuit 1100, a single-ended input circuit 1200, a signal processing circuit 1300, a test circuit 1400 and a number of memory chips 1500.

Among the terminals (for example 48, as discussed above) of the buffered DIMM 1000, 14 pairs of primary northbound terminals (for example, as discussed above) and 10 pairs of second southbound terminals (for example, as discussed above, for a total of 24 pairs of terminals, or 48 terminals total, may be commonly connected to the differential input circuit 1100 and the single-ended input circuit 1200.

The differential input circuit 1100 and the single-ended input circuit 1200 may be enabled or disabled in response to the transparent mode enable signal (TPE). The differential input circuit 1100 may be enabled responsive to a non-active state of the TPE signal and disabled responsive to an active state of the TPE signal.

The differential input circuit 1100 may generate 24 differential signals based on 24 pairs of input signals to provide the 24 differential signals to the signal processing circuit 1300 (for example, as discussed above). The signal processing circuit 1300 may process a packet signal of the buffered DIMM.

The single-ended input circuit 1200 may be enabled in response to an active state of the TPE signal and disabled in response to a non-active state of the TPE signal.

The structure of the differential input circuit 1100 and the single-ended input circuit 1200 may be the same as that of the first control signal transition circuit 510 shown in FIG. 5.

The test circuit 1400 may receive the mode control signal (TPE) and the data selection (DSS) signal. The test circuit 1400, in a normal mode, may allow 72-bit data provided from the signal processing circuit 1300 to be transmitted between the test circuit 1400 and the memory chips 1500 through 72 data lines.

In a test mode, the test circuit 1400 may receive 16-bit data from the single-ended input circuit 1200 and may write the 72-bit data to the memory chips 1500 or read the accessed 72-bit data from the memory chips 1500.

Figure 14:
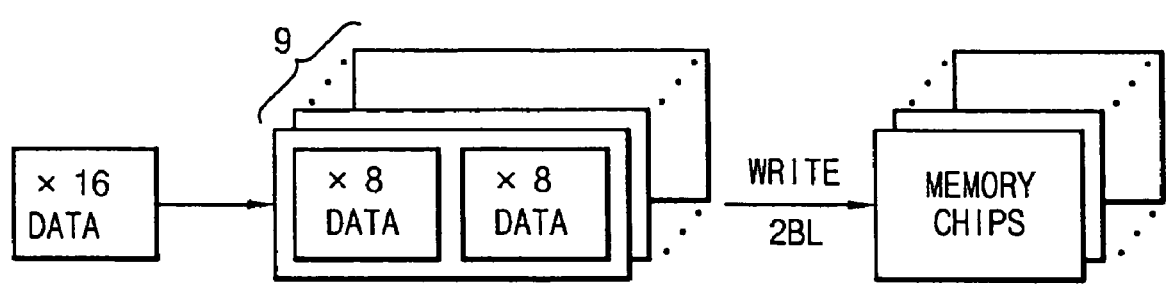
FIG. 14 is a schematic view illustrating a write-in operation of test data according to an exemplary embodiment of the present invention.

FIG. 14 is a schematic view illustrating a write-in operation of the test circuit 1400 of a buffered DIMM according to an exemplary embodiment of the present invention.

Referring to FIG. 14, the test circuit 1400 may receive 16-bit writing data and may duplicate the writing data (for example, by nine times) to generate additional data (for example, 144-bit data). 72-bit data may be provided twice to the memory chips 1500 so that total 144-bit data are written into the memory chips 1500.

FIG. 15 is a schematic view illustrating a comparison operation of the test circuit 1400 of the buffered DIMM according to an exemplary embodiment of the present invention.

Referring to FIG. 15, in a read-out operation of the test circuit 1400, each of 16-bit data written into the memory chips 1500 may be accessed during a burst read operation at a burst length of two. Therefore, total 144-bit data from the nine memory chips 1500 may be provided to the test circuit 1400.

The test circuit 1400 may sequentially compare the 16-bit expected data with 16-bit data of the accessed 144-bit data. Namely, the comparison operation between the expected data and the accessed data may be performed nine times. The accessed data of the memory chips may be tested based on a comparing result between the data from the memory chips 1500 and expected data. The comparing result of the test circuit 1400 may be outputted to the testing equipment 900. The structure of the test circuit 1400 may be the same as the data comparison circuit 330 shown in FIG. 8.

In accordance with above exemplary embodiments of the present invention, a hub of a memory module may multiply data and compare data with expected data. Thus, during a memory test operation, a deficiency in the number of taps of a conventional memory module may be overcome.

In addition, since various test patterns may be inputted into the memory, memory test coverage may be enhanced.

While this invention has been particularly shown and described with reference to exemplary embodiments thereof, it will be understood by those skilled in the art that various changes in form and details may be made therein without departing from the spirit and scope of the invention as defined by the following claims.

What is claimed:

1. A memory module, comprising:
   p memory chips;
   a hub to be converted into a control mode;
   a differential input circuit configured to receive differential pairs of packet signals through input terminals in a first mode in response to a mode control signal;
   a single ended input circuit configured to receive single ended input signals through the input terminals in a second mode in response to the mode control signal;
   a signal processing circuit configured to decode the differential pairs of packet signals outputted from the differential input circuit to control the p memory chips in the first mode; and
   a test circuit configured to test the p memory chips based on the single ended input signals received at the single ended input circuit, the test circuit includes:
      a first data path through which data are transferred between the signal processing circuit and the p memory chips in the first mode;
      a data writing circuit configured to allow test data provided from the single ended input circuit to be concurrently stored in the p memory chips in the second mode; and
      a comparison circuit configured to sequentially access the stored test data in the p memory chips, and configured to compare each of the accessed test data with expected data provided from the single-ended input circuit to generate a comparing result in the second mode, the comparison circuit includes:
         a multiplexer configured to access p×q bits of data of the p memory chips twice and to sequentially multiplex the accessed p×2×q bits of data in a unit of 2×q bits of data, the 2×q bits of data corresponding to the respective p memory chips; and
         a comparator configured to sequentially compare the multiplexed 2×q bits of data with 2×q bits of expected data provided from the single ended input circuit to generate the comparing result,
   wherein the differential input circuit and the single ended input circuit are disabled or enabled in response to the mode control signal.

2. The memory module of claim 1, wherein the data writing circuit includes:
   a buffer configured to receive 2q-bit data provided from the single-ended input circuit; and
   a data multiplier configured to duplicate the 2q-bit data to generate p×2q-bit data, and configured to simultaneously provide the duplicated p×2q-bit data twice to the p memory chips so that p×2q-bit data are provided to the p memory chips.

3. The memory module of claim 1, wherein the received differential input circuit is enabled in responsive to a non-active state of a control mode signal, and disabled in responsive to an active state of the control mode signal.

4. The memory module of claim 1, wherein the received single ended input circuit is enabled in responsive to an active state of a control mode signal, and disabled in responsive to a non-active state of the control mode signal.

5. A semiconductor chip module, comprising:
a hub to be converted into a control mode;
a pair of differential input terminals through which input signals are received;
a differential input circuit configured to generate a differential signal in a first mode based on the input signals received by the pair of differential input terminals;
a single-ended input circuit configured to produce two single ended signals in a second mode based on the input signals received from the pair of differential input terminals, and
a comparison circuit configured to sequentially access a stored test data in p memory chips, and configured to compare each accessed test data with expected data provided from the single-ended input circuit to generate a comparing result in the second mode, the comparison circuit includes:
a multiplexer configured to access p×q bits of data of the p memory chips twice and to sequentially multiplex the accessed p×2q bits of data in a unit of 2×q bits of data, the 2×q bits of data corresponding to the respective p memory chips; and
a comparator configured to sequentially compare the multiplexed 2×q bits of data with 2×q bits of expected data provided from the single ended input circuit to generate the comparing result,
wherein the differential input signals and the single ended input signals are disabled or enabled in response to the control mode.

6. The semiconductor chip module of claim 5, wherein the received differential input circuit is enabled in responsive to a non-active state of a control mode signal, and disabled in responsive to an active state of the control mode signal.

7. The semiconductor chip module of claim 5, wherein the single ended input circuit is enabled in response to an active state of a control mode signal, and disabled in responsive to a non-active state of the control mode signal.

8. A memory module, comprising:
p memory chips;
a hub to be converted into a control mode;
a differential input circuit configured to receive differential pairs of packet signals through input terminals in a first mode in response to a mode control signal;
a single ended input circuit configured to receive single ended input signals through the input terminals in a second mode in response to the mode control signal;
a signal processing circuit configured to decode the differential pairs of packet signals outputted from the differential input circuit to control the p memory chips in the first mode;
a test circuit configured to test the p memory chips based on the single ended input signals received at the single ended input circuit, and
a comparison circuit configured to sequentially access stored test data in the p memory chips, and configured to compare each accessed test data with expected data provided from the single-ended input circuit to generate a comparing result in the second mode, the comparison circuit includes:
a multiplexer configured to access p×q bits of data of the p memory chips twice and to sequentially multiplex the accessed p×2q bits of data in a unit of 2×q bits of data, the 2×q bits of data corresponding to the respective p memory chips; and
a comparator configured to sequentially compare the multiplexed 2×q bits of data with 2×q bits of expected data provided from the single ended input circuit to generate the comparing result,
wherein the differential input circuit and the single ended input circuit are disabled or enabled in response to the mode control signal.

9. The memory module of claim 8, wherein the test circuit includes:
a first data path through which data are transferred between the signal processing circuit and the p memory chips in the first mode; and
a data writing circuit configured to allow the test data provided from the single ended input circuit to be concurrently stored in the p memory chips in the second mode.

10. The memory module of claim 9, wherein the data writing circuit includes:
a buffer configured to receive 2q-bit data provided from the single-ended input circuit; and
a data multiplier configured to duplicate the 2q-bit data to generate p×2q-bit data, and configured to simultaneously provide the duplicated p×2q-bit data twice to the p memory chips so that p×2q-bit data are provided to the p memory chips.

* * * * *